(12) United States Patent
Ando

(10) Patent No.: US 8,558,639 B2
(45) Date of Patent: Oct. 15, 2013

(54) HIGH FREQUENCY SWITCH

(75) Inventor: Akira Ando, Urayasu (JP)

(73) Assignee: Soshin Electric Co., Ltd., Saku (JP)

( * ) Notice: Subject to any disclaimer, the term of this patent is extended or adjusted under 35 U.S.C. 154(b) by 357 days.

(21) Appl. No.: 13/062,826

(22) PCT Filed: Sep. 28, 2009

(86) PCT No.: PCT/JP2009/066780
§ 371 (c)(1),
(2), (4) Date: Mar. 8, 2011

(87) PCT Pub. No.: WO2010/038700
PCT Pub. Date: Apr. 8, 2010

(65) Prior Publication Data
US 2011/0163792 A1    Jul. 7, 2011

(30) Foreign Application Priority Data
Sep. 30, 2008    (JP) ................. 2008-255305

(51) Int. Cl.
*H01P 1/15*    (2006.01)
*H01P 1/10*    (2006.01)

(52) U.S. Cl.
USPC ........................ 333/103; 333/104

(58) Field of Classification Search
USPC ........................ 333/101, 103, 104
See application file for complete search history.

(56) References Cited

U.S. PATENT DOCUMENTS

| | | | |
|---|---|---|---|
| 5,193,218 A | 3/1993 | Shimo | |
| 5,634,200 A * | 5/1997 | Kitakubo et al. | 455/82 |
| 5,999,065 A * | 12/1999 | Furutani et al. | 333/103 |
| 6,070,059 A | 5/2000 | Kato et al. | |
| 6,847,829 B2 | 1/2005 | Tanaka et al. | |
| 7,075,386 B2 * | 7/2006 | Kearns | 333/103 |
| 7,391,283 B2 * | 6/2008 | Kearns | 333/103 |
| 8,089,328 B2 * | 1/2012 | Bizien et al. | 333/101 |
| 8,390,394 B2 * | 3/2013 | Ando | 333/103 |
| 8,421,552 B2 * | 4/2013 | Ando | 333/103 |
| 2005/0221767 A1 | 10/2005 | Suga et al. | |
| 2010/0253445 A1 | 10/2010 | Ando | |

FOREIGN PATENT DOCUMENTS

| | | |
|---|---|---|
| JP | 60-174534 A1 | 9/1985 |
| JP | 01-033961 B2 | 7/1989 |
| JP | 06-058628 U1 | 8/1994 |
| JP | 2532122 B2 | 9/1996 |
| JP | 09-083206 A1 | 3/1997 |

(Continued)

OTHER PUBLICATIONS

U.S. Appl. No. 12/992,716, filed Nov. 15, 2010, Ando, Akira.

*Primary Examiner* — Dean O Takaoka
(74) *Attorney, Agent, or Firm* — Burr & Brown

(57) ABSTRACT

Provided is a high frequency switch wherein first switch circuits, each of which includes a first PIN diode, are connected in parallel to one or more first λ/4 signal transmitting paths which transmit transmitting signals, and second switch circuits, each of which includes a second PIN diode, are connected in parallel to one or more second λ/4 signal transmitting paths which transmit receiving signals to a receiving terminal. A first control voltage is applied to the cathode of the first PIN diode, and a second control voltage is applied to the cathode of the second PIN diode. Furthermore, a biasing circuit which applies a constant bias voltage is connected to each anode of the first PIN diode and the second PIN diode.

9 Claims, 20 Drawing Sheets

(56) References Cited

FOREIGN PATENT DOCUMENTS

| | | |
|---|---|---|
| JP | 10-335902 A1 | 12/1998 |
| JP | 2830319 B2 | 12/1998 |
| JP | 2962418 B2 | 10/1999 |
| JP | 2003-037521 A1 | 2/2003 |
| JP | 2005-065277 A1 | 3/2005 |
| JP | 3627704 B2 | 3/2005 |
| JP | 2005-295503 A1 | 10/2005 |
| JP | 3823843 B2 | 9/2006 |
| JP | 2009-152749 A1 | 7/2009 |

* cited by examiner

HIGH FREQUENCY SWITCH

TECHNICAL FIELD

The present invention relates to a high frequency switch for switching between high frequency signals, and more particularly to a high frequency switch suitable for use as an antenna switch connected to an antenna, e.g., a TDD (Time Division Duplex) switch or the like.

BACKGROUND ART

Conventional high frequency switches such as antenna switches include a microwave switch disclosed in Japanese Patent No. 2532122 and a transmission and reception switching device disclosed in Japanese Patent No. 2830319, for example.

The microwave switch disclosed in Japanese Patent No. 2532122 has PIN diodes inserted in series and parallel in a signal line. Forward currents are passed through the PIN diodes to turn them on, and the PIN diodes are reversely biased to turn them off, thereby switching between high frequency signals.

The transmission and reception switching device disclosed in Japanese Patent No. 2830319 employs a circuit scheme wherein a switch is constructed of transmission lines and PIN diodes or the like which are connected in series to the transmission lines, the transmission lines and the PIN diodes being connected parallel to a signal transmission line.

SUMMARY OF INVENTION

There are two types of transmission and reception switching schemes (a first transmission and reception switching scheme and a second transmission and reception switching scheme) using high frequency switches, as described below.

According to the first transmission and reception switching scheme, as shown in FIG. 18, a transmission amplifier 108 and an isolator 111 are connected to a transmission signal line 106 between a transceiver 100 and a transmission and reception antenna 102 (or via a bandpass filter 104), and a reception amplifier 112 is connected to a reception signal line 110 between the transceiver 100 and the transmission and reception antenna 102 (or via the bandpass filter 104). A high frequency switch 114 is connected to the junction between the transmission signal line 106 and the reception signal line 110.

According to the second transmission and reception switching scheme, as shown in FIG. 19, a transmission amplifier 108 is connected to a transmission signal line 106, and a reception amplifier 112 and a high frequency switch 114 are connected to a reception signal line 110. A circulator 116 is connected to the junction between the transmission signal line 106 and the reception signal line 110.

In the above high frequency switches, for example, a PIN diode is used for a switching element. Since the anodes or cathodes of the PIN diodes are all grounded in direct current, it is necessary to use both of a positive power supply and a negative power supply for switching operation.

Therefore, if a positive power supply is used for a circuit system in the above-mentioned transmission and reception switching scheme, it is necessary to newly prepare a negative power supply. Conversely, if a negative power supply is used for a circuit system in the above-mentioned transmission and reception switching scheme, it is necessary to newly prepare a positive power supply. Then, the number of parts used becomes large, and the entire circuit configuration thereof becomes structurally complex.

The circuit disclosed in Japanese Patent No. 2830319 does not require a dual power supply (both the positive and negative power supplies). The circuit, however, is not reversely biased when the diodes are turned off. Accordingly, it is not possible to achieve sufficient switching characteristics since the diodes are used while the junction capacitance of the diodes is large. Further, since transistors and inverters are necessary as well as a control circuit, the number of parts used becomes large.

The present invention has been made in view of the above problems. It is an object of the present invention to provide a high frequency switch which requires only a single power supply (either a positive power supply or a negative power supply) in place of both of a positive power supply and a negative power supply, and which can be used while the diodes are reversely biased and the junction capacitance thereof is small, and which can avoid the increase in the number of parts used and the structural complexity of circuit configuration, and which can avoid the decrease in switching speed.

According to the present invention, a high frequency switch includes a first switch circuit connected parallel to at least one first signal transmission line for transmitting a transmission signal from a transmission terminal, the first switch circuit having at least one first PIN diode, and a second switch circuit connected parallel to at least one second signal transmission line for transmitting a reception signal to a reception terminal, the second switch circuit having at least one second PIN diode, wherein in the first switch circuit, a first transmission line is connected in series to a circuit including the at least one first PIN diode while an anode of the first PIN diode is connected to the first transmission line, in the second switch circuit, a second transmission line is connected in series to a circuit including the at least one second PIN diode while an anode of the second PIN diode is connected to the second transmission line, cathodes of the PIN diodes are grounded at high frequencies, ends of resonant elements or resonant lines are connected to the cathodes of the PIN diodes, and other ends thereof are free ends, a first control terminal is electrically connected to one of the anode and the cathode of the first PIN diode, a first control voltage being supplied to the first control terminal, a second control terminal is electrically connected to one of the anode and the cathode of the second PIN diode, a second control voltage being supplied to the second control terminal, and a bias applying circuit is provided for applying a constant bias voltage to other of the cathodes and the anodes of the PIN diodes.

With the above arrangement, the high frequency switch requires only a single power supply (either a positive power supply or a negative power supply) in place of both of a positive power supply and a negative power supply, can be used while the PIN diodes are reversely biased and the junction capacitance thereof is small, can avoid the increase in the number of parts used and the complexity of circuit configuration, and can avoid the decrease in switching speed.

Meanwhile, instead of one end of a resonant element (or a resonant line) having the other free end, it is conceivable that a capacitor Cx may be connected between the cathode of each of the PIN diodes and GND, as shown in FIG. 20 illustrating a reference example. Due to Q factor or a parasitic capacitance of the capacitor Cx, a sufficiently-low impedance cannot be achieved, so that it is difficult to ground the cathode at high frequencies.

In the present invention, to the cathode of each of the PIN diodes, one end of the resonant element (or the resonant line) is connected, and the other end thereof is a free end. By this impedance changing function, a sufficiently-low impedance can be achieved, so that it is possible to ground the cathode at high frequencies.

In the present invention, the first switch circuit may be turned on and the second switch circuit is turned off when 0 V<Vc1<Vcc<Vc2 or 0 V>Vc2>Vcc>Vc1, and the first switch circuit is turned off and the second switch circuit is turned on when 0 V<Vc2<Vcc<Vc1 or 0 V>Vc1>Vcc>Vc2, where Vc1 represents the first control voltage, Vc2 represents the second control voltage, and Vcc represents the bias voltage.

Similarly, the first switch circuit may be turned on and the second switch circuit is turned off when 0 V<Vc2<Vcc<Vc1 or 0 V>Vc1>Vcc>Vc2, and the first switch circuit is turned off and the second switch circuit is turned on when 0 V<Vc1<Vcc<Vc2 or 0 V>Vc2>Vcc>Vc1, where Vc1 represents the first control voltage, Vc2 represents the second control voltage, and Vcc represents the bias voltage.

In the present invention, fo represents a central frequency of an operating frequency band, and λ represents a wavelength corresponding to the central frequency fo, in the first switch circuit, the first transmission line and a parallel resonant circuit including the at least one first PIN diode are connected in series to the first signal transmission line, in the second switch circuit, the second transmission line and a parallel resonant circuit including the at least one second PIN diode are connected in series to the second signal transmission line, constants of the parallel resonant circuits may be set to equalize resonant frequencies at time the PIN diodes are turned off with the central frequency fo.

In the present invention, the high frequency switch may further comprise a directional coupler having the first signal transmission line as a component thereof, for detecting at least a reflected wave of the transmission signal.

In the present invention, a resistor for forming a reception terminating resistance may be connected parallel to the second PIN diode of the second switch circuit which is connected parallel to the second signal transmission line that is connected at least to the reception terminal.

Further, an electrical length of each of the above-mentioned first and second signal transmission lines is not limited, and the signal transmission line may have a length such as a 3λ/4 signal transmission line and a λ/4 signal transmission line. It is, however, preferable to use a λ/4 signal transmission line in view of the reduction in size or the like.

Further, an electrical length of each of the above-mentioned first and second transmission lines is not limited, and the transmission line may have a length such as a 3λ/4 transmission line or a λ/4 transmission line. It is, however, preferable to use a λ/4 transmission line in view of the reduction in size or the like.

Further, an electrical length of each of the above-mentioned resonant elements or resonant lines is not limited, and the resonant element or resonant line may have a length such as a 3λ/4 resonant element (or a 3λ/4 resonant line) or a λ/4 resonant element (or a λ/4 resonant line). It is, however, preferable to use a λ/4 resonant element (or a λ/4 resonant line) in view of the reduction in size or the like.

As described above, the high frequency switch according to the present invention requires only a single power supply (either a positive power supply or a negative power supply) in place of both of a positive power supply and a negative power supply, can be used while the PIN diodes are reversely biased and the junction capacitance thereof is small, can avoid the increase in the number of parts used and the complexity of circuit configuration, and can avoid the decrease in switching speed.

BRIEF DESCRIPTION OF DRAWINGS

FIG. 6 is a diagram showing an equivalent circuit of the first antenna switch when the first switch circuit is turned off and the second switch circuit is turned on;

FIG. 16 is a diagram showing an equivalent circuit of the antenna switch according to the sixth modified example when a first switch circuit is turned off and a second switch circuit is turned on;

DESCRIPTION OF EMBODIMENTS

Embodiments wherein a high frequency switch according to the present invention is applied, for example, to an antenna switch will be described below with reference to FIGS. 1 through 17. It is assumed that λ represents a wavelength corresponding to the central frequency of an operating frequency band of the switch, and refers to a wavelength in transmission lines described below.

Figure 1:
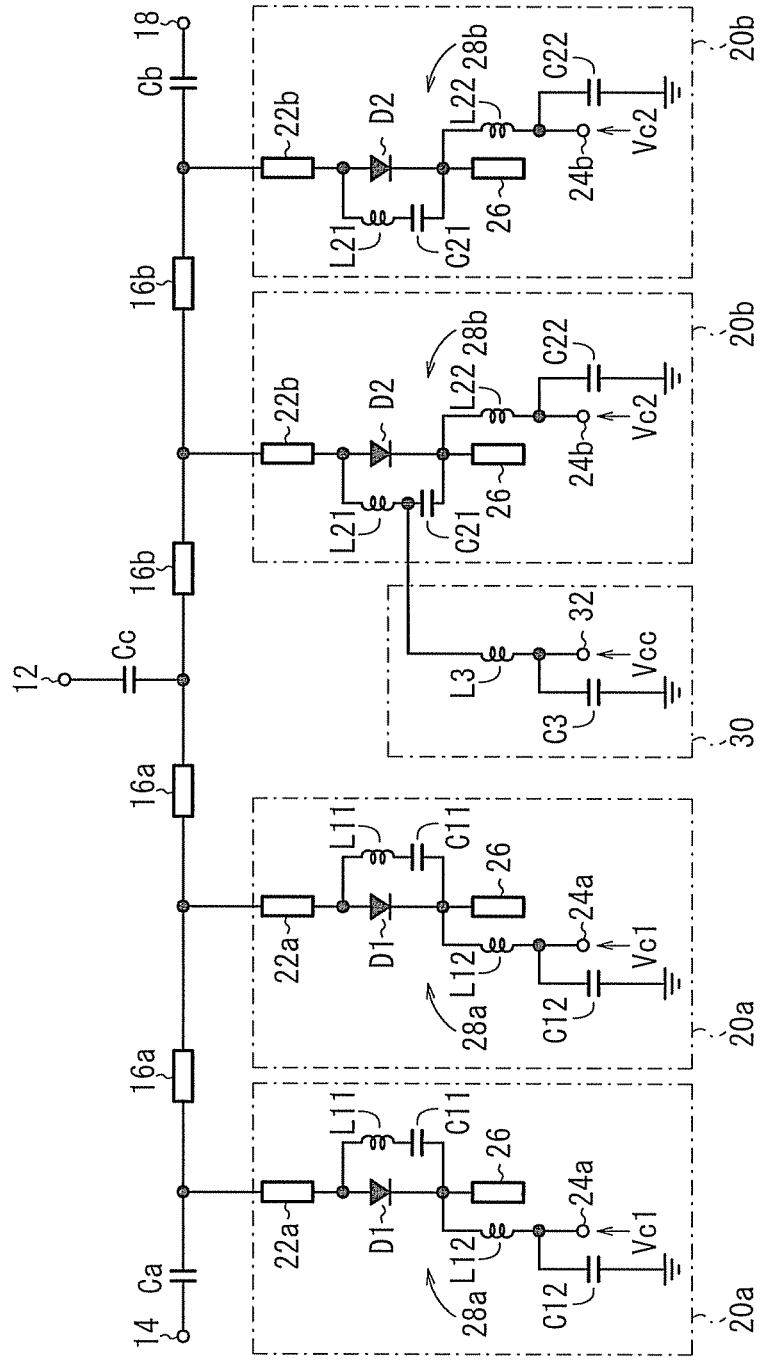
FIG. 1 is a circuit diagram showing a configuration of a first antenna switch.

As shown in FIG. 1, an antenna switch according to a first embodiment (hereinafter referred to as a first antenna switch 10A) comprises two first λ/4 signal transmission lines 16a connected between an antenna connection terminal 12 and a transmission terminal 14, two second λ/4 signal transmission lines 16b connected between the antenna connection terminal 12 and a reception terminal 18, first switch circuits 20a connected parallel to the respective first λ/4 signal transmission lines 16a, and second switch circuits 20b connected parallel to the respective second λ/4 signal transmission lines 16b.

Capacitors Ca through Cc are connected respectively between the transmission terminal 14 and the first λ/4 signal transmission line 16a adjacent to the transmission terminal 14, between the reception terminal 18 and the second λ/4 signal transmission line 16b adjacent to the reception terminal 18, between a junction between the first λ/4 signal transmission line 16a and the second λ/4 signal transmission line 16b which are adjacent to each other and the antenna connection terminal 12. The capacitors Ca through Cc are capacitors for blocking currents for turning on and off PIN diodes, to be described later, or direct currents supplied via a bias terminal 32, to be described later, and operate as a short circuit at high frequencies.

In the first switch circuit 20a, a first λ/4 transmission line 22a is connected in series to a circuit including a first PIN diode D1 while an anode of the first PIN diode D1 is connected to the first λ/4 transmission line 22a.

The circuit including the first PIN diode D1 comprises a series-connected circuit of an eleventh inductor L11 and an eleventh capacitor C11 which are connected between the anode and a cathode of the first PIN diode D1. In the circuit, the eleventh inductor L11 is connected to the anode and the eleventh capacitor C11 is connected to the cathode. The eleventh capacitor C11 operates as a capacitor for blocking direct currents supplied via the bias terminal 32, to be described later. Further, a series-connected circuit of a twelfth inductor L12 and a twelfth capacitor C12 is connected between the cathode of the first PIN diode D1 and GND (ground). A first control terminal 24a is connected to a junction between the twelfth inductor L12 and the twelfth capacitor C12.

To the cathode of the first PIN diode D1, one end of a λ/4 resonant element 26 (or λ/4 resonant line) is connected, and the other end thereof is a free end (infinite resistance). Therefore, the cathode side of the first PIN diode D1 is grounded at high frequencies. Thus, a combined circuit made up of the first PIN diode D1 and the series-connected circuit of the eleventh inductor L11 and the eleventh capacitor C11 configures a first parallel resonant circuit 28a. The twelfth capacitor C12 operates as a capacitor for blocking currents for turning on and off the first PIN diode D1, and the twelfth inductor L12 operates as a choke coil.

In the second switch circuit 20b, a second λ/4 transmission line 22b is connected in series to a circuit including a second PIN diode D2 while an anode of the second PIN diode D2 is connected to the second λ/4 transmission line 22b.

The circuit including the second PIN diode D2 comprises a series-connected circuit of a twenty-first inductor L21 and a twenty-first capacitor C21 which are connected between the anode and a cathode of the second PIN diode D2. In the circuit, the twenty-first inductor L21 is connected to the anode and the twenty-first capacitor C21 is connected to the cathode. The twenty-first capacitor C21 operates as a capacitor for blocking direct currents supplied via the bias terminal 32, to be described later. Further, a series-connected circuit of a twenty-second inductor L22 and a twenty-second capacitor C22 is connected between the cathode of the second PIN diode D2 and GND (ground). A second control terminal 24b is connected to a junction between the twenty-second inductor L22 and the twenty-second capacitor C22.

To the cathode of the second PIN diode D2, one end of a λ/4 resonant element 26 (or λ/4 resonant line) is connected, and the other end thereof is a free end (infinite resistance). Therefore, the cathode side of the second PIN diode D2 is grounded at high frequencies. Thus, a combined circuit made up of the second PIN diode D2 and the series-connected circuit of the twenty-first inductor L21 and the twenty-first capacitor C21 configures a second parallel resonant circuit 28b. The twenty-second capacitor C22 operates as a capacitor for blocking currents for turning on and off the second PIN diode D2, and the twenty-second inductor L22 operates as a choke coil.

In the first antenna switch 10A, a bias circuit 30 is connected to one of the two second switch circuits 20b, which is close to the antenna connection terminal 12.

The bias circuit 30 is a circuit for applying the constant bias voltage Vcc to the anodes of the first PIN diodes D1 of the first switch circuits 20a and the anodes of the second PIN diodes D2 of the second switch circuits 20b. In this embodiment, the bias circuit 30 comprises a series-connected circuit of a third inductor L3 and a third capacitor C3 which are connected between a junction between the twenty-first inductor L21 and the twenty-first capacitor C21 of the second switch circuit 20b and GND (ground), and the bias terminal 32 connected to a junction between the third inductor L3 and the third capacitor C3. The third capacitor C3 operates as a capacitor for blocking direct currents supplied via the bias terminal 32. The third inductor L3 functions as a choke coil for supplying the direct currents that are supplied to the bias terminal 32 to the respective anodes of the first PIN diodes D1 and the respective anodes of the second PIN diodes D2. Accordingly, by applying the constant bias voltage Vcc to the bias terminal 32, the constant bias voltage Vcc is applied to the respective anodes of the first PIN diodes D1 and the respective anodes of the second PIN diodes D2.

The first control voltage Vc1 is applied to the first control terminals 24a, and the second control voltage Vc2 is applied to the second control terminals 24b.

Accordingly, the first switch circuits 20a are turned on and the second switch circuits 20b are turned off when the bias voltage Vcc, the first control voltage Vc1, and the second control voltage Vc2 have a magnitude relationship of:

$$0\ V < Vc1 < Vcc < Vc2\ \text{or}\ 0\ V > Vc2 > Vcc > Vc1$$

Conversely, the first switch circuits 20a are turned off and the second switch circuits 20b are turned on when the bias voltage Vcc, the first control voltage Vc1, and the second control voltage Vc2 have a magnitude relationship of:

$$0\ V < Vc2 < Vcc < Vc1\ \text{or}\ 0\ V > Vc1 > Vcc > Vc2$$

In the following description, when the relationship of $0\ V < Vc1 < Vcc$ or $0\ V > Vcc > Vc1$ is established as to the first control voltage Vc1, the first control voltage Vc1 is called as a first forward voltage. Also, when the relationship of $0\ V < Vc2 < Vcc$ or $0\ V > Vcc > Vc2$ is established as to the second control voltage Vc2, the second control voltage Vc2 is called as a second forward voltage. Similarly, when the relationship of $0\ V < Vcc < Vc1$ or $0\ V > Vc1 > Vcc$ is established as to the first control voltage Vc1, the first control voltage Vc1 is called as a first reverse voltage. Also, when the relationship of $0\ V < Vcc < Vc2$ or $0\ V > Vc2 > Vcc$ is established as to the second control voltage Vc2, the second control voltage Vc2 is called as a second reverse voltage.

Next, circuit operation of the first antenna switch 10A will be described below with reference to FIGS. 2A through 7.

The first switch circuit 20a will primarily be described below. First, when the bias voltage Vcc is applied to the bias terminal 32, the bias voltage Vcc is applied to the anodes of the first PIN diodes D1 and the anodes of the second PIN diodes D2.

In this state, when the first forward voltage of the first control voltage Vc1 is applied to the first control terminal 24a, the first PIN diode D1 is turned on. At this time, the first switch circuit 20a is represented by an equivalent circuit shown in FIG. 2A. Specifically, a circuit comprising an inductance La and an ON resistance Ro of the first PIN diode D1 which are connected parallel to each other is connected in series between the first λ/4 transmission line 22a and GND.

Conversely, when the first reverse voltage of the first control voltage Vc1 is applied to the first control terminal 24a, the first PIN diode D1 is turned off. At this time, the first switch circuit 20a is represented by an equivalent circuit shown in FIG. 2B. Specifically, a parallel resonant circuit comprising an inductance La, a parasitic capacitance Cf due to the depletion layer of the first PIN diode D1, and a parallel resistance Rf of the first PIN diode D1 which are connected parallel to each other is connected in series between the first λ/4 transmission line 22a and GND.

In the first antenna switch 10A, the inductance La has a value established such that the central frequency fo of the first antenna switch 10A and the resonant frequency of the parallel resonant circuit that is made up of the parasitic capacitance Cf, the parallel resistance Rf, and the inductance La are in agreement with each other.

The ON resistance Ro is generally of about 1 ohm or less. Since the ON resistance Ro can be expressed as Ro<<2πfoLa, the first switch circuit 20a can be represented by an equivalent circuit shown in FIG. 3A in the vicinity of the central frequency fo when the first PIN diode D1 is turned on, and can be represented by an equivalent circuit shown in FIG. 3B in the vicinity of the central frequency fo when the first PIN diode D1 is turned off.

Figure 4:
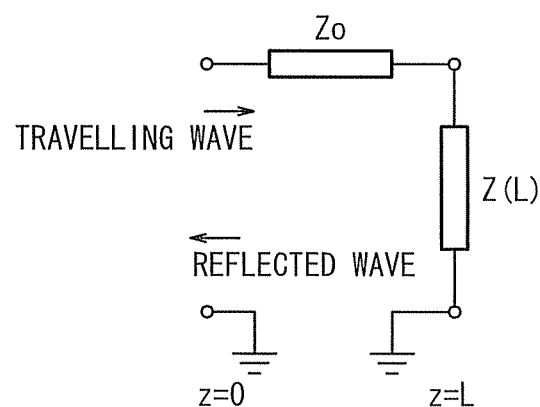
FIG. 4 is a diagram illustrative of the relationship between input and output impedances of a transmission line.

It is assumed that, as shown in FIG. 4, a transmission line z=L is terminated by the load of an impedance Z(L).

If the transmission line has a characteristic impedance Zo, a travelling wave is represented by $Ae^{-\gamma z}$, and a reflected wave is represented by $Be^{-\gamma z}$ (γ indicates a propagation constant), then a voltage V(z) and a current I(z) at a reference point z are expressed by the following equations:

$$V(z) = Ae^{-\gamma z} + Be^{\gamma z}$$

$$I(z) = (A/Zo)e^{-\gamma z} - (B/Zo)e^{\gamma z}$$

Therefore, the impedance Z(L) at z=L is expressed by the following equation:

$$Z(L) = V(L)/I(L)$$
$$= Zo\{(Ae^{-\gamma L} + Be^{\gamma L})/(Ae^{-\gamma L} - Be^{\gamma L})\}$$

A reflection coefficient Γ(L) has a relationship expressed by the following equation (a):

$$\Gamma(L) = (Be^{\gamma L})/(Ae^{-\gamma L}) \quad (a)$$
$$= (B/A)e^{2\gamma L}$$
$$= \{Z(L) - Zo\}/\{Z(L) + Zo\}$$

An impedance Z(0) of the load as seen at z=0 is expressed by the following equation (b):

$$Z(0) = Zo\{(A+B)/(A-B)\} \quad (b)$$

From the equation (a), $$B/A = [\{Z(L) - Zo\}/\{Z(L) + Zo\}]e^{-2\gamma L}$$

By substituting this equation into the equation (b), the following equation (c) is obtained:

$$Z(0)/Zo = \{Z(L) + Zo \tan h\gamma L\}/\{Zo + Z(L)\tan h\gamma L\} \quad (c)$$

where γ=α+jβ (α represents an attenuation constant and β a phase constant expressed by β=2π/λ).

Since α=0 and γ=jβ for a lossless line, the equation (c) can be modified into the following equation (d):

$$Z(0)/Zo = \{Z(L) + jZo \tan \beta L\}/\{Zo + jZ(L)\tan \beta L\} \quad (d)$$

By substituting L=λ/4 into the equation (d), the following equation (e) is obtained:

$$Z(0)/Zo = Zo/Z(L)$$

$$Z(0) = Zo^2/Z(L) \quad (e)$$

Inasmuch as Z(L) is a low resistance of about 1 ohm or less when the first PIN diode D1 is turned on, the impedance (in this case, Z(0)) of the first λ/4 transmission line 22a on the signal line side is of a large value, and the signal line is ideally in an open state, as can be understood from the equation (e). Conversely, inasmuch as Z(L) is a high resistance of about 10 k ohms or more when the first PIN diode D1 is turned off, the impedance (in this case, Z(0)) of the first λ/4 transmission line 22a on the signal line side is of a small value, and the signal line is ideally in a short-circuited state, as can be understood from the equation (e).

Figure 5:
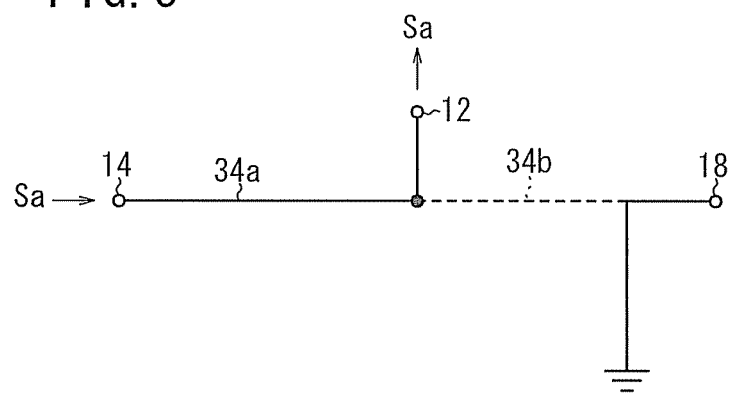
FIG. 5 is a diagram showing an equivalent circuit of the first antenna switch when the first switch circuit is turned on and a second switch circuit is turned off.

Therefore, when the first forward voltage of the first control voltage Vc1 is applied to the first control terminals 24a, turning on the first PIN diodes D1, and the second reverse voltage of the second control voltage Vc2 is applied to the second control terminals 24b, turning off the second PIN diodes D2, the first antenna switch 10A is represented by an equivalent circuit shown in FIG. 5 wherein only the transmission terminal 14 is connected to the antenna connection terminal 12 at high frequencies. A transmission signal Sa supplied to the transmission terminal 14 is thus transmitted via the antenna connection terminal 12. In other words, a first signal line 34a from the transmission terminal 14 to the antenna connection terminal 12 serves as a signal transmission side, and a second signal line 34b from the reception terminal 18 to the antenna connection terminal 12 serves as a signal cutoff side.

Figure 6:
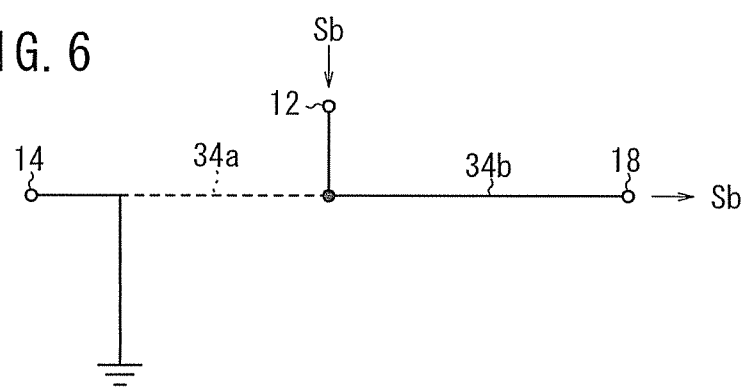

Conversely, when the first reverse voltage of the first control voltage Vc1 is applied to the first control terminals 24a, turning off the first PIN diodes D1, and when the second forward voltage of the second control voltage Vc2 is applied to the second control terminals 24b, turning on the second PIN diodes D2, the first antenna switch 10A is represented by an equivalent circuit shown in FIG. 6 wherein only the reception terminal 18 is connected to the antenna connection terminal 12 at high frequencies. A reception signal Sb received by the antenna is thus supplied to the antenna connection terminal 12 and output from the reception terminal 18. In other words, the first signal line 34a from the transmission terminal 14 to the antenna connection terminal 12 serves as a signal cutoff side, and the second signal line 34b from the reception terminal 18 to the antenna connection terminal 12 serves as a signal transmission side.

Figure 2A:
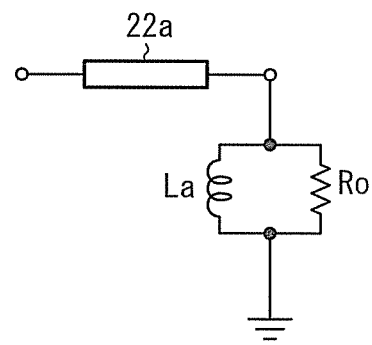
FIG. 2A is a diagram showing an equivalent circuit of a first switch circuit of the first antenna switch when a first PIN diode is turned on, and FIG. 2B is a diagram showing an equivalent circuit of the first switch circuit when the first PIN diode is turned off.
Figure 2B:
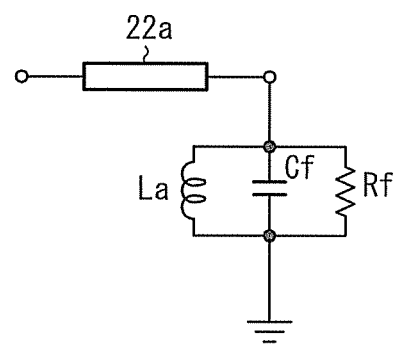
Figure 3A:
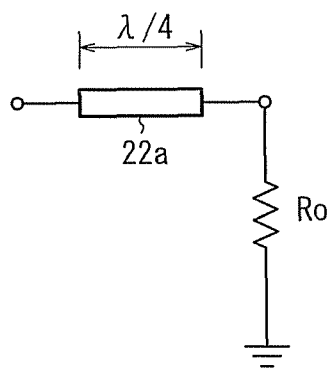
FIG. 3A is a diagram showing an equivalent circuit of the first switch circuit in the vicinity of a central frequency when the first PIN diode is turned on, and FIG. 3B is a diagram showing an equivalent circuit of the first switch circuit in the vicinity of a central frequency when the first PIN diode is turned off.
Figure 3B:
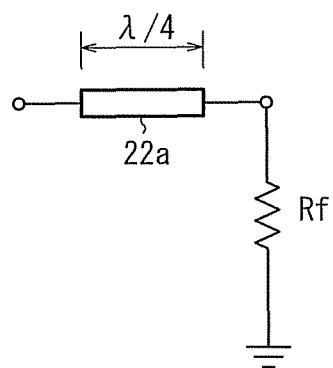

If the first parallel resonant circuit 28a is dispensed with and only the first PIN diode D1 is connected, then the first switch circuit 20a is not represented by the equivalent circuit shown in FIG. 3B in the vicinity of the central frequency fo when the first PIN diode D1 is turned off, but the parasitic capacitance Cf remains, as shown in FIG. 2B, shifting the resonant frequency into a low frequency range. As a result, the phase characteristic of the first λ/4 transmission line 22a suffers an error, thereby causing a loss.

With the first antenna switch 10A, each of the constants of the eleventh inductors L11 of the first parallel resonant circuits 28a is adjusted to equalize the resonant frequencies of the first parallel resonant circuits 28a at the time the first PIN diodes D1 are turned off with the central frequency fo of the first antenna switch 10A. Similarly, each of the constants of the twenty-first inductors L21 of the second parallel resonant circuits 28b is adjusted to equalize the resonant frequencies of the second parallel resonant circuits 28b at the time the second PIN diodes D2 are turned off with the central frequency fo of the first antenna switch 10A.

Since the ON resistance Ro of the PIN diode is expressed as Ro<<2πfoLa, only the ON resistance Ro is connected to GND of the first λ/4 transmission line 22a when the first PIN diode D1 is turned on, and only the parallel resistance Rf is connected to GND of the first λ/4 transmission line 22a when the first PIN diode D1 is turned off, for example, as shown in FIGS. 3A and 3B. Consequently, the resonant frequencies of the first λ/4 transmission line 22a at the time the first PIN diode D1 is turned on and off do not deviate from each other.

With the first antenna switch 10A, therefore, the phase characteristics of the first λ/4 transmission line 22a and the second λ/4 transmission line 22b do not suffer an error, and the passband at the time the switch circuits are turned on and the isolation band at the time the switch circuits are turned off are held in conformity with each other. In other words, the first antenna switch 10A is capable of appropriately minimizing the insertion loss caused when the switch circuits are turned on and maximizing the isolation provided when the switch circuits are turned off in a band that is used by the antenna switch. As a result, the loss of a transmission signal caused in the switch circuits is reduced, and an appropriate amount of attenuation at the time the switch circuits are turned off is secured.

Further, in the first antenna switch 10A, since all of the bias voltage Vcc, the first control voltage Vc1, and the second control voltage Vc2 can be set to positive voltages or negative voltages, it is not necessary to use both of a positive power supply and a negative power supply. Thus, a single power supply (positive power supply or negative power supply) is sufficient. When the first PIN diodes D1 and the second PIN diodes D2 are reversely biased, the junction capacitance can be small. Further, it is possible to avoid the increase in the number of parts used in the first antenna switch 10A, and the structural complexity of the circuit configuration thereof.

Further, in the first antenna switch 10A, to the cathode of each of the first PIN diodes D1 and the second PIN diodes D2, one end of each of the λ/4 resonant elements 26 (or λ/4 resonant lines) is connected, and the other end thereof is a free end (infinite resistance). Accordingly, the following advantages can be obtained.

Figure 20:
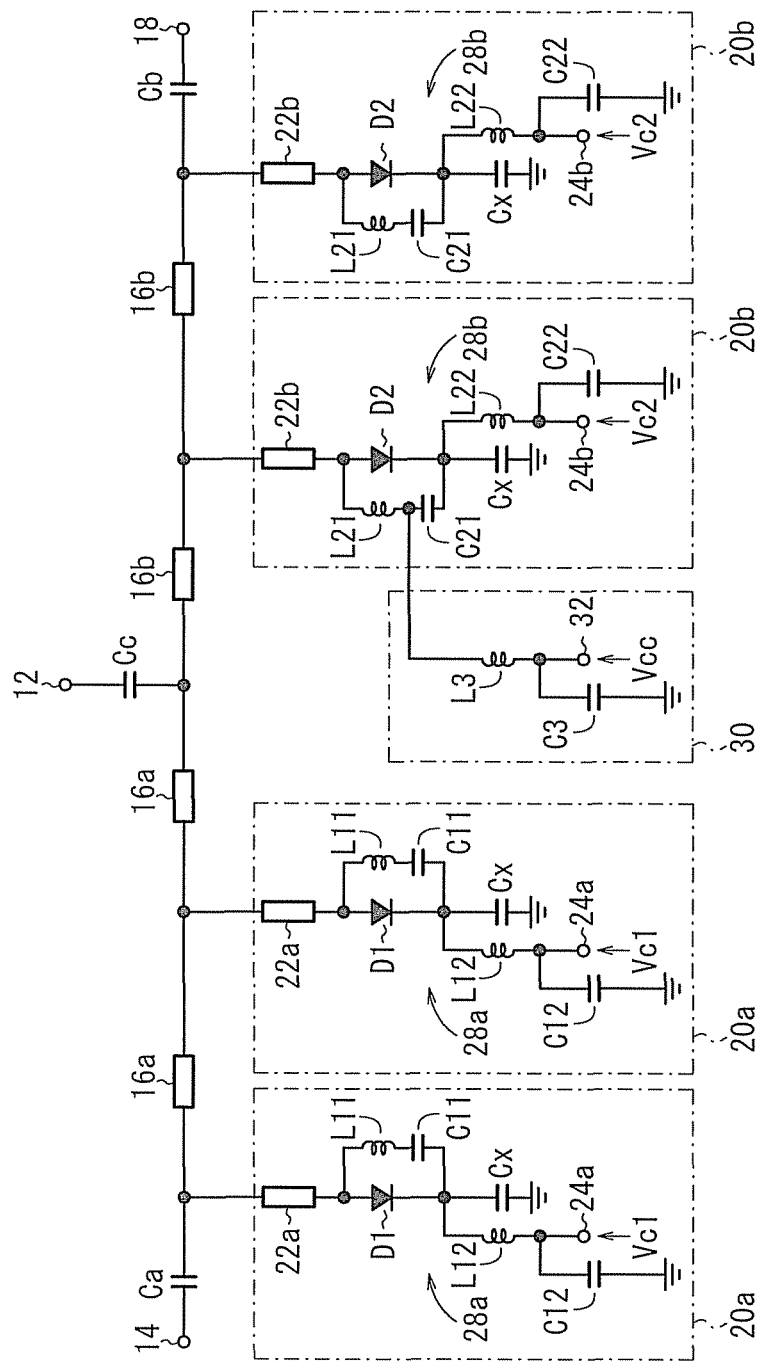
FIG. 20 is a diagram illustrative of an antenna switch according to a reference example.

For example, instead of the λ/4 resonant element 26 (or λ/4 resonant line), it is conceivable that a capacitor Cx may be connected between the cathode of each of the first PIN diodes D1 and the second PIN diodes D2 and GND (ground), as shown in FIG. 20 illustrating an antenna switch 200 according to a comparative example. Due to Q factor or a parasitic capacitance of the capacitor Cx, a sufficiently-low impedance cannot be achieved, so that it is difficult to ground the cathode of each of the first PIN diodes D1 and the second PIN diodes D2 at high frequencies.

In the first antenna switch 10A, to the cathode of each of the first PIN diodes D1 and the second PIN diodes D2, one end of each of the λ/4 resonant elements 26 (or λ/4 resonant lines) is connected, and the other end thereof is a free end. By this impedance changing function, a sufficiently-low impedance can be achieved, so that it is possible to ground the cathode of each of the first PIN diodes D1 and the second PIN diodes D2 at high frequencies.

In the above embodiment, the first parallel resonant circuit 28a is provided in the first switch circuit 20a, and the second parallel resonant circuit 28b is provided in the second switch circuit 20b. Alternatively, the first parallel resonant circuit 28a and the second parallel resonant circuit 28b may be dispensed with. Then, the cathodes of the first PIN diodes D1 may be connected to the respective first control terminals 24a, and the cathodes of the second PIN diodes D2 may be connected to the respective second control terminals 24b. Then, it is possible to simplify circuit configuration.

Next, several antenna switches according to various modified examples of the first antenna switch 10A will be described below with reference to FIGS. 7 to 16.

Figure 7:
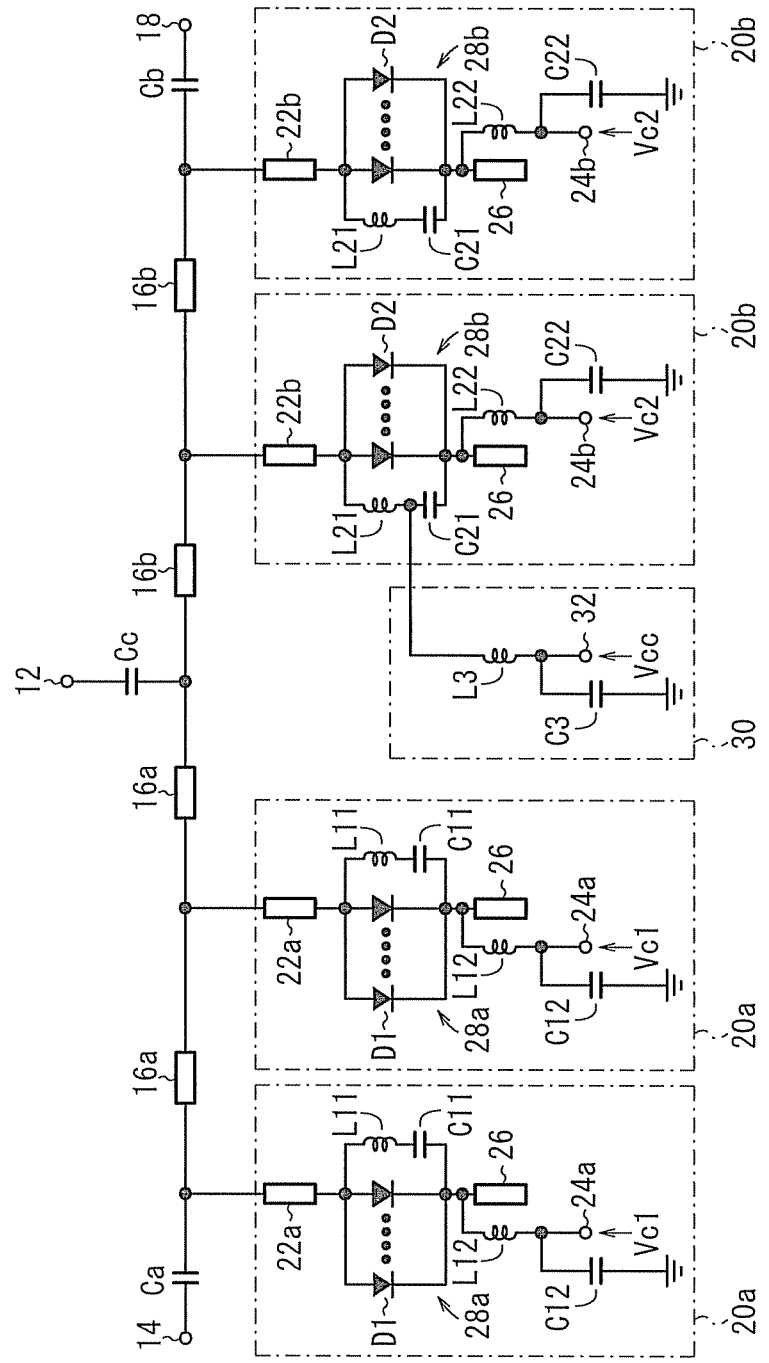
FIG. 7 is a circuit diagram showing a configuration of an antenna switch according to a first modified example.

As shown in FIG. 7, an antenna switch 10Aa according to a first modified example is of a configuration substantially similar to the first antenna switch 10A described above, but is different in a configuration as follows. In each of first switch circuits 20a, a plurality of parallel first PIN diodes D1 are connected, and in each of second switch circuits 20b, a plurality of parallel second PIN diodes D2 are connected.

In this case, also, each of the constants of the eleventh inductors L11 of the first parallel resonant circuits 28a is adjusted to equalize the resonant frequencies of the first parallel resonant circuits 28a at the time the first PIN diodes D1 are turned off with the central frequency of the antenna switch 10Aa.

Similarly, each of the constants of the twenty-first inductors L21 of the second parallel resonant circuits 28b is adjusted to equalize the resonant frequencies of the second parallel resonant circuits 28b at the time the second PIN diodes D2 are turned off with the central frequency of the antenna switch 10Aa.

When the first switch circuit 20a is turned on, i.e., when all the first PIN diodes D1 are turned on, the resistance between the first λ/4 transmission line 22a and GND is represented by a resistance which is lower than one ON resistance. As can be understood from the equation (e) above, the impedance at the end on the first signal line 34a side of the first λ/4 transmission line 22a is an impedance higher than with one ON resistance. The switch circuits thus approach an ideal open state.

Conversely, when the first switch circuit 20a is turned off, i.e., when all the first PIN diodes D1 are turned off, only parallel resistances, which are high, are connected between the first λ/4 transmission line 22a and GND. As can be understood from the equation (e) above, the impedance at the end on the first signal line 34a side of the first λ/4 transmission line 22a is a low impedance depending on the high resistance. In other words, the insertion loss of the switch circuits upon signal transmission can further be reduced.

Next, an antenna switch 10Ab according to a second modified example will be described below with reference to FIGS. 8 and 9.

Figure 8:
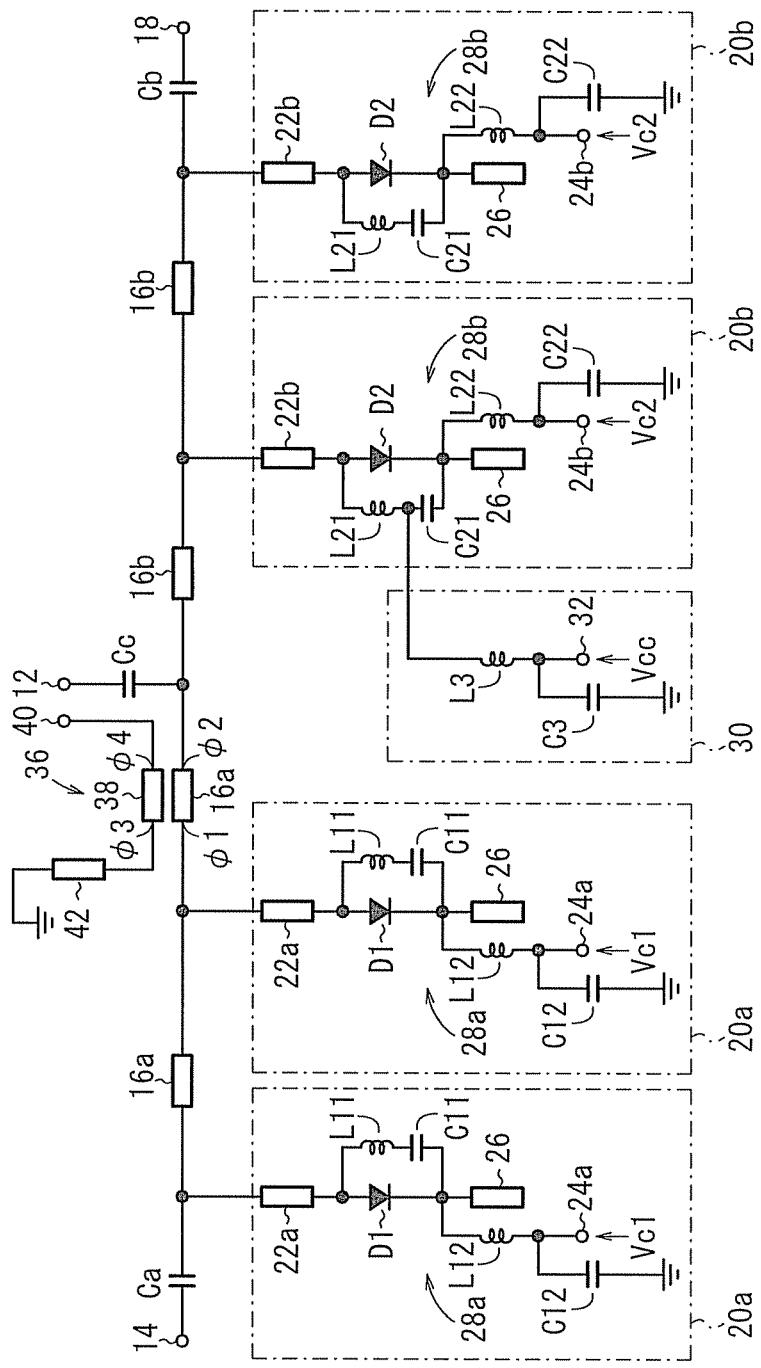
FIG. 8 is a circuit diagram showing a configuration of an antenna switch according to a second modified example.
Figure 9:
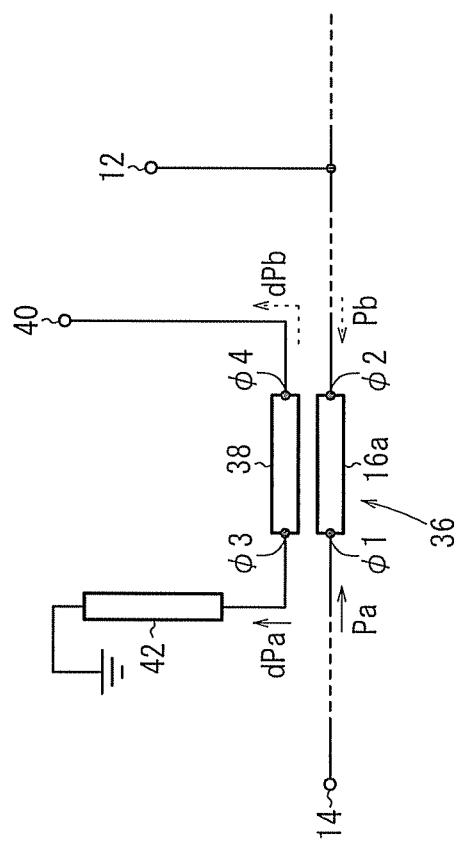
FIG. 9 is a diagram showing the manner in which a directional coupler operates.

The antenna switch 10Ab as shown in FIG. 8 is of a configuration substantially similar to the first antenna switch 10A described above, but is different in that the antenna switch 10Ab comprises a directional coupler 36 having a first λ/4 signal transmission line 16a as a component thereof. The directional coupler 36 detects a reflected wave of a transmission signal.

The directional coupler 36 comprises the above-mentioned first λ/4 signal transmission line 16a, a λ/4 line 38 disposed so as to face the first λ/4 signal transmission line 16a, a reflected wave output terminal 40 connected to one end of the λ/4 line 38, and a terminating resistor 42 connected to the other end of the λ/4 line 38. Another end of the terminating resistor 42 is grounded.

The principles of operation of the directional coupler 36 will be described below with reference to FIG. 9. First, a first end φ1 to a fourth end φ4 of the directional coupler 36 will be defined as follows. The first end φ1 refers to an end of the first λ/4 signal transmission line 16a on the side of the transmission terminal 14, the second end φ2 refers to an end of the first λ/4 signal transmission line 16a on the side of the antenna connection terminal 12, the third end φ3 refers to an end of the λ/4 line 38 on the side of the transmission terminal 14, and the fourth end φ4 refers to an end of the λ/4 line 38 on the side of the antenna connection terminal 12.

When a travelling wave electric power Pa by a transmission signal from the transmission terminal 14 is applied to the first end φ1 of the directional coupler 36, a travelling wave is produced at the second end φ2, and also an electric wave (signal) is produced at the third end φ3, having an electric power dPa in proportion to the travelling wave electric power Pa. The wave is reflected at an antenna, and a reflected wave electric power Pb is applied to the second end φ2 of the directional coupler 36. Then, a reflected wave is produced at the first end φ1, and also an electric wave (signal) is produced at the fourth end φ4, having an electric power dPb in proportion to the reflected wave electric power Pb. In other words, a signal in proportion to the reflected wave electric power Pb is output from the reflected wave output terminal 40 that is connected to the fourth end φ4 of the directional coupler 36. Accordingly, the reflected wave can be detected.

Thus, when an output transmission signal is reflected at an antenna, a signal in proportion to a reflected wave can be read out at the reflected wave output terminal 40 of the directional coupler 36, so that the reflected wave can be detected. In this case, it is only necessary that the λ/4 line 38 is disposed so as to face the first λ/4 signal transmission line 16a. Therefore, a reflected wave of a transmission signal can be detected without increasing the number of parts used.

Thus, since the antenna switch 10Ab according to the second modified example can detect a reflected wave of a transmission signal even with a single antenna switch, it is possible to enhance the reduction in the number of parts used for a transmission system or a transceiving system with a reflected wave detection function, and the reduction in size thereof. Also, it is further possible to enhance the reduction in a production cost and in a transmission loss.

Figure 10:
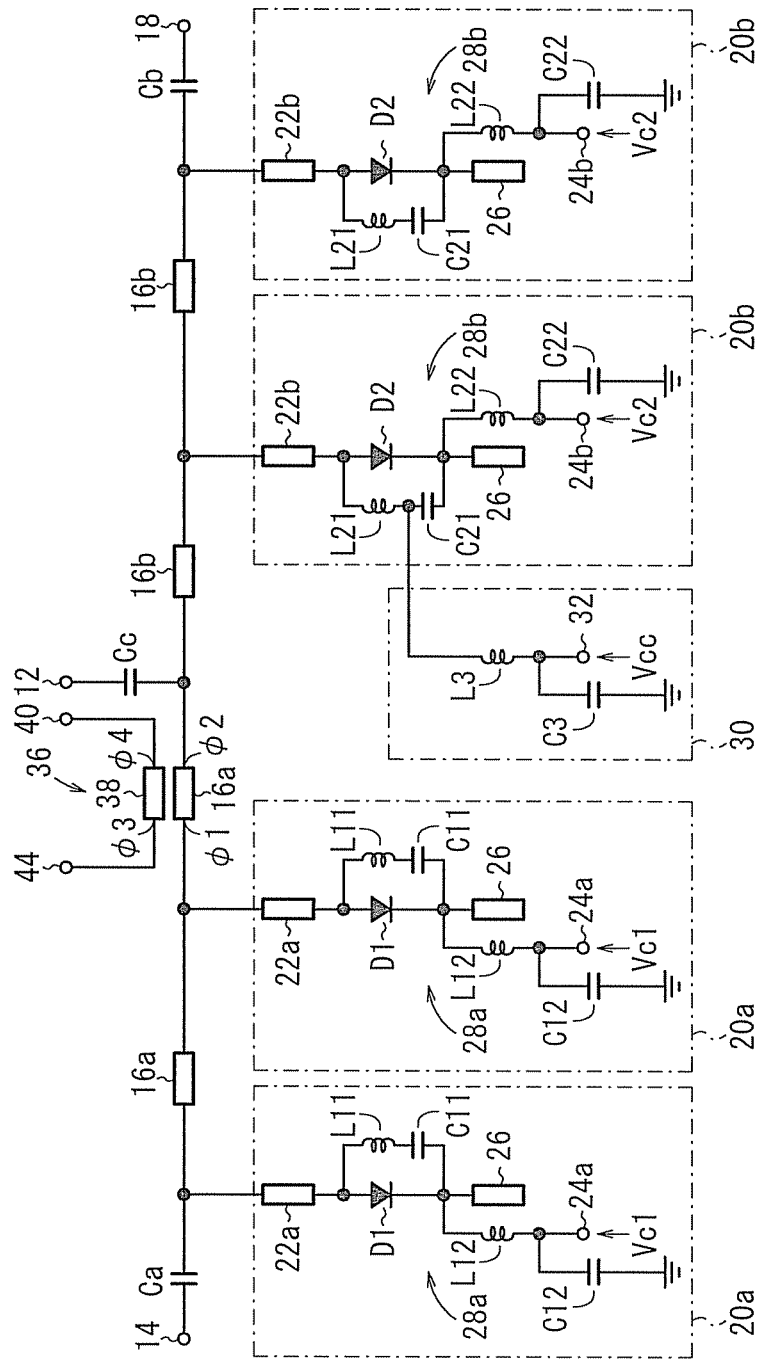
FIG. 10 is a circuit diagram showing a configuration of an antenna switch according to a third modified example.

Next, as shown in FIG. 10, an antenna switch 10Ac according to a third modified example is of a configuration substantially similar to the antenna switch 10Ab according to the second modified example described above, but is different in a configuration of a directional coupler 36 as follows:

The directional coupler 36 comprises the first λ/4 signal transmission line 16a, and the λ/4 line 38 disposed so as to face the first λ/4 signal transmission line 16a. The third end φ3 (an end of the λ/4 line 38 on the side of the transmission terminal 14) is connected to a travelling wave output terminal 44, and the fourth end φ4 (an end of the λ/4 line 38 on the side of the antenna connection terminal 12) is connected to the reflected wave output terminal 40.

Thus, a signal in proportion to the travelling wave electric power Pa (see FIG. 9) is output from the travelling wave output terminal 44 connected to the third end φ3 of the directional coupler 36. Also, a signal in proportion to the reflected wave electric power Pb is output from the reflected wave output terminal 40 connected to the fourth end φ4 of the directional coupler 36. Therefore, a reflected wave and a travelling wave of a transmission signal can be detected.

Figure 11:
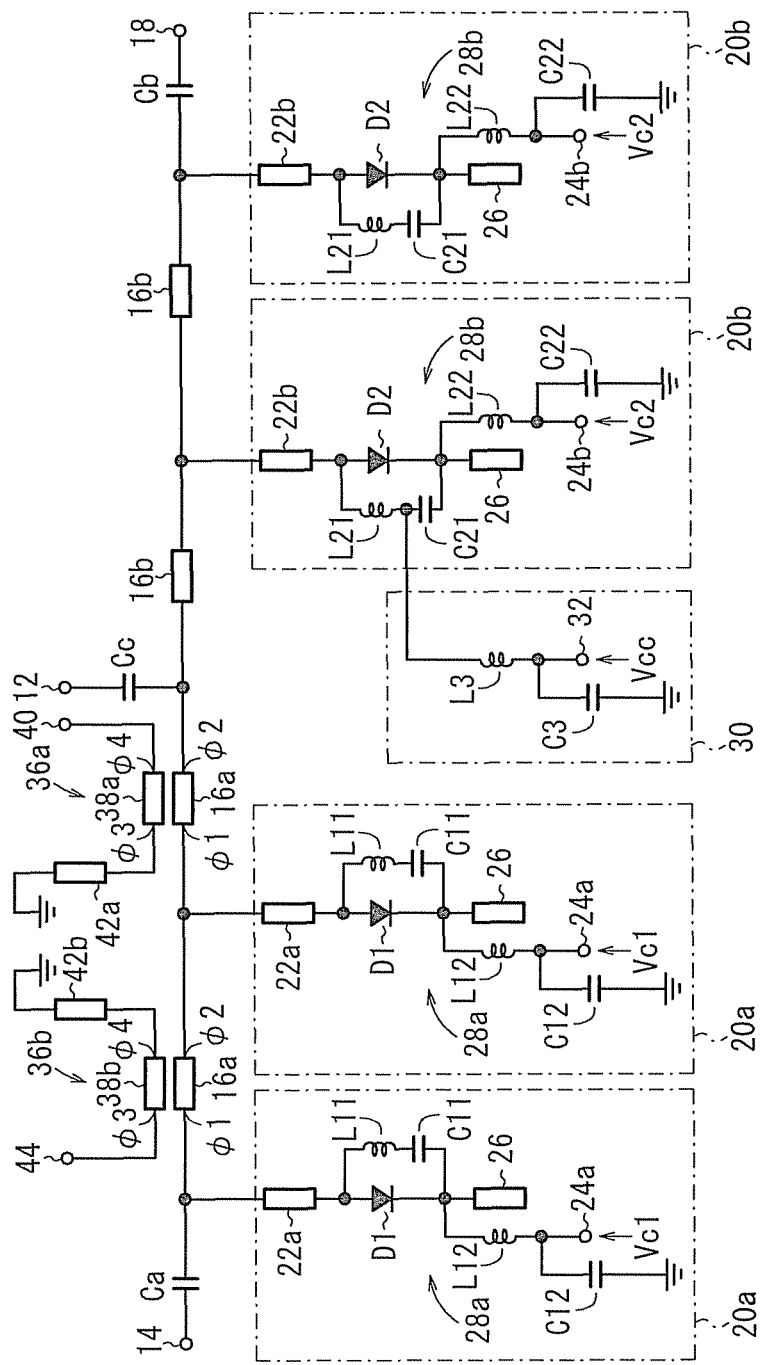
FIG. 11 is a circuit diagram showing a configuration of an antenna switch according to a fourth modified example.

As shown in FIG. 11, an antenna switch 10Ad according to a fourth modified example is of a configuration substantially similar to the antenna switch 10Ab according to the second modified example described above, but is different therefrom as follows:

A first directional coupler 36a and a second directional coupler 36b are included. The first directional coupler 36a has the first λ/4 signal transmission line 16a, which is for example close to the antenna connection terminal 12, as a component thereof, for detecting a reflected wave of a transmission signal. The second directional coupler 36b has the first λ/4 signal transmission line 16a, which is close to the transmission terminal 14, as a component thereof, for detecting a travelling wave of a transmission signal.

The first directional coupler 36a comprises the above-mentioned first λ/4 signal transmission line 16a, a first λ/4 line 38a disposed so as to face the first λ/4 signal transmission line 16a, a reflected wave output terminal 40 connected to one end (fourth end φ4) of the first λ/4 line 38a, and a first terminating resistor 42a connected to the other end (third end φ3) of the first λ/4 line 38a.

The second directional coupler 36b comprises the above-mentioned first λ/4 signal transmission line 16a, a second λ/4 line 38b disposed so as to face the first λ/4 signal transmission line 16a, a travelling wave output terminal 44 connected to one end (third end φ3) of the second λ/4 line 38b, and a second terminating resistor 42b connected to the other end (fourth end φ4) of the second λ/4 line 38b. Other ends of the first terminating resistor 42a and the second terminating resistor 42b are grounded.

In this case, a signal in proportion to the travelling wave electric power Pa (see FIG. 9) is output from the travelling wave output terminal 44 connected to the third end φ3 of the second directional coupler 36b. Also, a signal in proportion to the reflected wave electric power Pb is output from the reflected wave output terminal 40 connected to the fourth end φ4 of the first directional coupler 36a. Therefore, a reflected wave and a travelling wave of a transmission signal can be detected.

Further, even if the characteristics of a monitor circuit (reflected wave detection circuit) connected to the reflected wave output terminal 40 and the characteristics of a monitor circuit (travelling wave detection circuit) connected to the travelling wave output terminal 44 are different from each other, each of the output characteristics of the first directional coupler 36a and the second directional coupler 36b can be set independently to be in accordance with the characteristics of each of the monitor circuits. Therefore, the directional couplers can be designed more freely.

An antenna switch 10Ae according to a fifth modified example will be described below with reference to FIG. 12.

Figure 12:
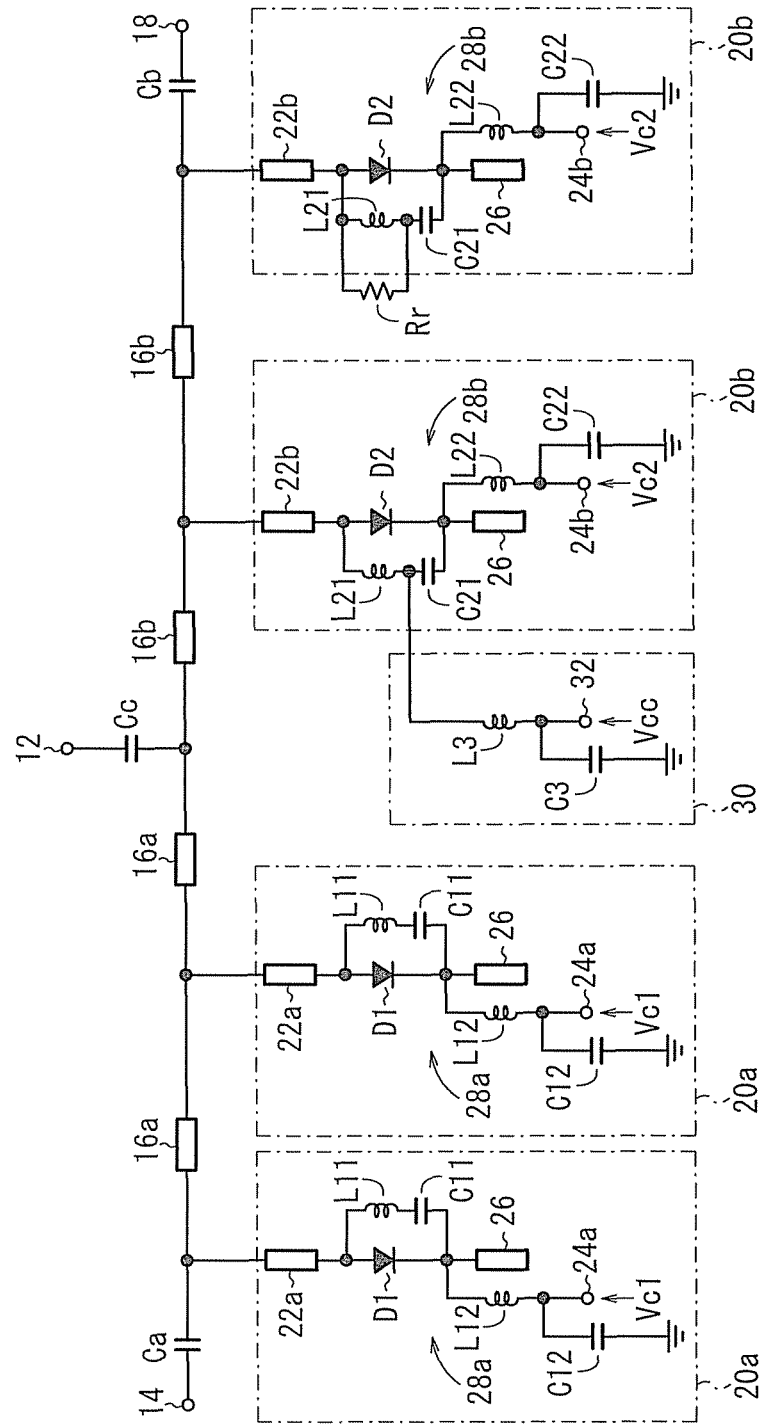
FIG. 12 is a circuit diagram showing a configuration of an antenna switch according to a fifth modified example.
Figure 13A:
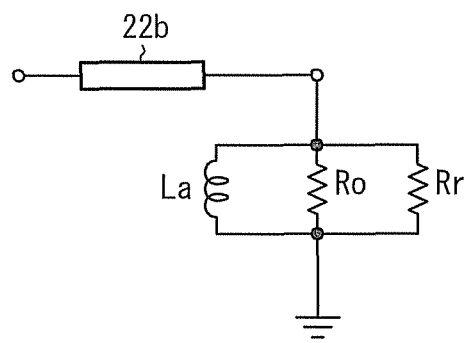
FIG. 13A is a diagram showing an equivalent circuit of a second switch circuit of the antenna switch according to the fifth modified example when a second PIN diode is turned on, and FIG. 13B is a diagram showing an equivalent circuit of the second switch circuit when the second PIN diode is turned off.
Figure 13B:
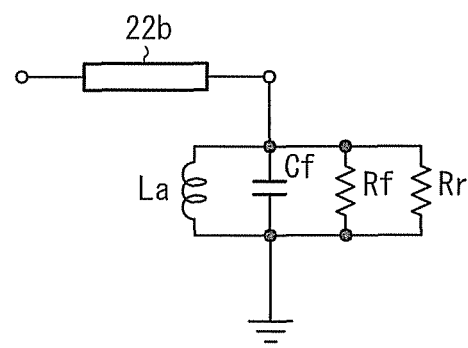

As shown in FIG. 12, the antenna switch 10Ae is of a configuration substantially similar to the first antenna switch 10A described above, but is different therefrom in that a resistor Rr for forming a reception terminating resistance is connected parallel to the twenty-first inductor L21 of the second switch circuit 20b which is adjacent to the reception terminal 18.

Operation of the second switch circuit 20b will primarily be described below. In the second switch circuit 20b, when the second forward voltage of the first control voltage Vc2 is applied to the second control terminal 24b, the second PIN diode D2 is turned on. At this time, the second switch circuit 20b is represented by an equivalent circuit shown in FIG. 13A. Specifically, a circuit comprising an inductance La, an ON resistance Ro of the second PIN diode D2, and the resistor Rr for forming a reception terminating resistance which are connected parallel to each other is connected in series between the second λ/4 transmission line 22b and GND.

Conversely, when the second reverse voltage of the second control voltage Vc2 is applied to the second control terminal 24b, the second PIN diode D2 is turned off. At this time, the second switch circuit 20b is represented by an equivalent circuit shown in FIG. 13B. Specifically, a parallel resonant circuit comprising an inductance La, a parasitic capacitance Cf due to the depletion layer of the second PIN diode D2, a parallel resistance Rf of the second PIN diode D2, and the resistor Rr for forming a reception terminating resistance which are connected parallel to each other is connected in series between the second λ/4 transmission line 22b and GND.

In this case, also, the inductance La also has a value established such that the central frequency fo of the antenna switch 10Ae and the resonant frequency of the parallel resonant circuit that is made up of the parasitic capacitance Cf, the parallel resistance Rf, and the inductance La are in agreement with each other.

As described above, the second switch circuit 20b is of a configuration including the parallel-connected resistor Rr for forming a reception terminating resistance. Since the ON resistance Ro and the resistor Rr have a magnitude relationship of Ro<<Rr, the resistor Rr does not affect the operation of the second switch circuit 20b when the second PIN diode D2 is turned on. Since the parallel resistance Rf and the resistor Rr have a magnitude relationship of Rf>>Rr, the impedance on the signal line side is determined by the resistor Rr.

Specifically, if the characteristic impedance of the second λ/4 transmission line 22b is of 50 ohms and the resistor Rr for forming a reception terminating resistance is of 50 ohms, then the combined resistance (Rf//Rr) of the parallel resistance Rf (e.g., 10 k ohms) and the resistor Rr is of 49.751 ohms. The impedance of the second λ/4 transmission line 22b on the signal line side is terminated with 50×50/49.751=50.250 ohms according to the equation (e) (the terminating resistance is of 50.250 ohms). Actually, the value of the resistor Rr is determined so that the terminating resistance is of 50 ohms, for example.

When the second PIN diode D2 is turned on, if the ON resistance Ro=1 ohm, then since the combined resistance (Ro//Rr) of the ON resistance Ro and the resistor Rr is of 0.9804 ohm, the impedance of the second λ/4 transmission line 22b on the signal line side is of 50×50/0.9804=2550 ohms according to the equation (e).

Figure 14:
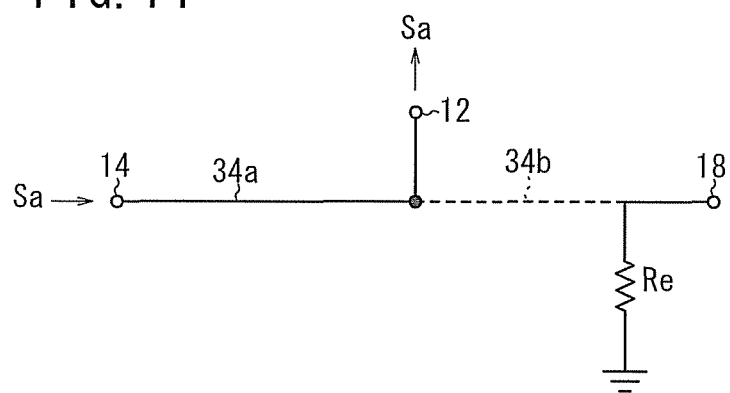
FIG. 14 is a diagram showing an equivalent circuit of the antenna switch according to the fifth modified example when the first switch circuit is turned on and the second switch circuit is turned off.

Therefore, when the first forward voltage of the first control voltage Vc1 is applied to the first control terminals 24a, turning on the first PIN diodes D1, and the second reverse voltage of the second control voltage Vc2 is applied to the second control terminals 24b, turning off the second PIN diodes D2, the antenna switch 10Ae is represented by an equivalent circuit shown in FIG. 14 wherein only the transmission terminal 14 is connected to the antenna connection terminal 12 at high frequencies, and a terminating resistor Re of 50 ohms, for example, is connected to the reception terminal 18. A transmission signal Sa supplied to the transmission terminal 14 is thus transmitted via the antenna connection terminal 12. In other words, the first signal line 34a from the transmission terminal 14 to the antenna connection terminal 12 serves as a signal transmission side, and the second signal line 34b from the reception terminal 18 to the antenna connection terminal 12 serves as a signal cutoff side.

If the resistor Rr for forming a reception terminating resistance were not present, then the impedance of the second λ/4 transmission line 22b on the signal line side would be of a small value, and the signal line is ideally in a short-circuited state, as described above. In other words, since the impedance on the receiver side when the switch is turned off is of 0 ohm, resulting in total reflection, the reception amplifier connected to the reception terminal 18 may become unstable in operation.

Inasmuch as the antenna switch 10Ae according to the fifth modified example includes a resistor Rr for forming a reception terminating resistance is connected parallel to the twenty-first inductor L21 of the second switch circuit 20b which is adjacent to the reception terminal 18, as mentioned above, the impedance on the receiver side when the switch is turned off is of the value of the terminating resistor Re, e.g., 50 ohms, thereby allowing the antenna switch 10Ae to achieve impedance matching with other circuits. Therefore, the reception amplifier connected to the reception terminal 18 is rendered stable in operation.

Conversely, when the first reverse voltage of the first control voltage Vc1 is applied to the first control terminals 24a, turning off the first PIN diodes D1, and the second forward voltage of the second control voltage Vc2 is applied to the second control terminals 24b, turning on the second PIN diodes D2, the antenna switch 10Ae is represented by the equivalent circuit shown in FIG. 6 wherein only the reception terminal 18 is connected to the antenna connection terminal 12 at high frequencies, and a reception signal Sb received by the antenna is thus supplied to the antenna connection terminal 12 and output from the reception terminal 18. In other words, the first signal line 34a from the transmission terminal 14 to the antenna connection terminal 12 serves as a signal cutoff side, and the second signal line 34b from the reception terminal 18 to the antenna connection terminal 12 serves as a signal transmission side. Therefore, the resistor Rr does not affect reception of the signal.

Figure 15:
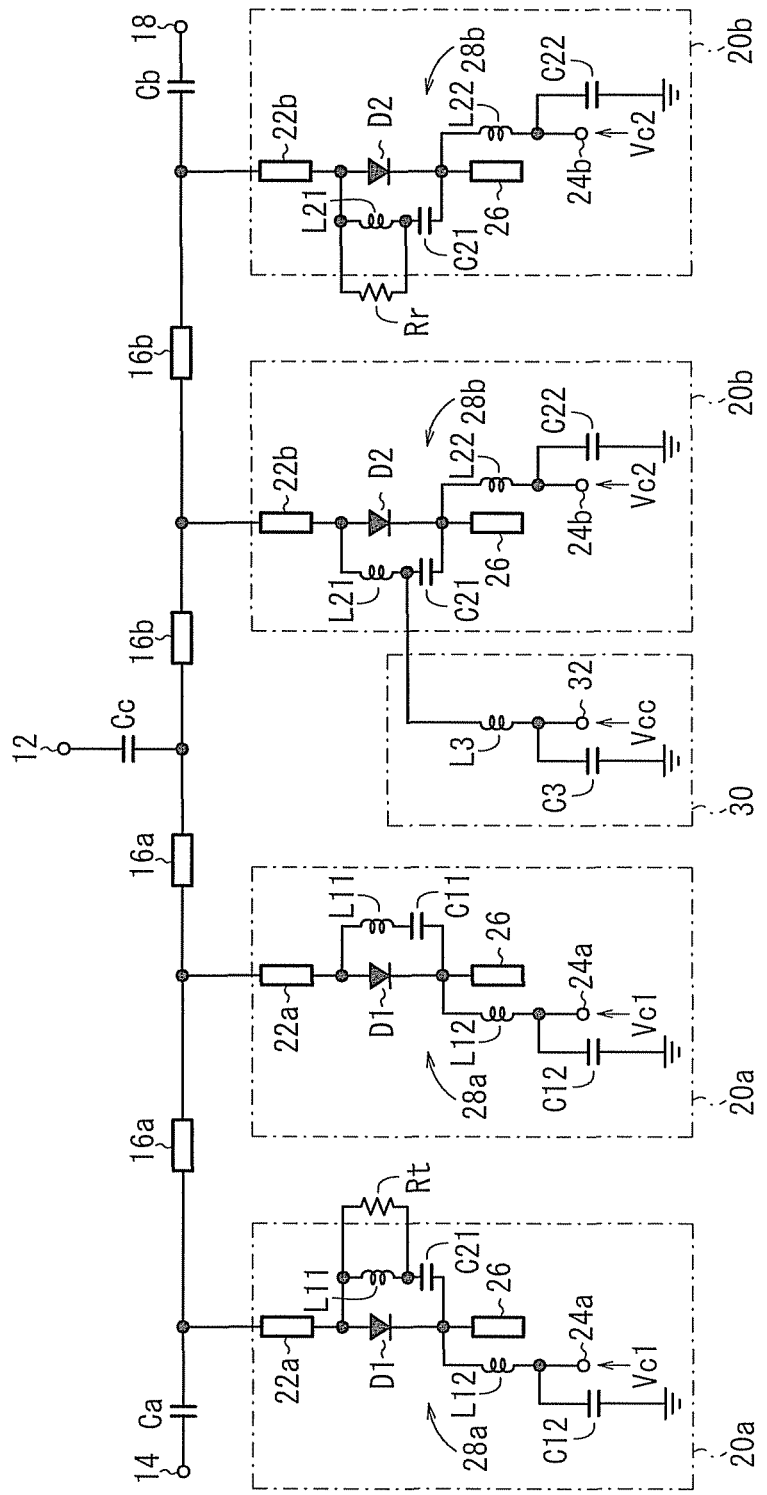
FIG. 15 is a circuit diagram showing a configuration of an antenna switch according to a sixth modified example.

Next, as shown in FIG. 15, an antenna switch 10Af according to a sixth modified example is of a configuration which is substantially similar to the antenna switch 10Ae according to the fifth modified example described above, but is different therefrom in that a resistor Rt for forming a transmission terminating resistance is connected parallel to the eleventh inductor L11 of the first switch circuit 20a which is adjacent to the transmission terminal 14.

Therefore, when the first forward voltage of the first control voltage Vc1 is applied to the first control terminals 24a, turning on the first PIN diodes D1, and the second reverse voltage of the second control voltage Vc2 is applied to the second control terminals 24b, turning off the second PIN diodes D2, the antenna switch 10Af is represented by the equivalent circuit shown in FIG. 14 wherein only the transmission terminal 14 is connected to the antenna connection terminal 12 at high frequencies, and a terminating resistor Re of 50 ohms, for example, is connected to the reception terminal 18. In this case, the impedance on the receiver side when the switch is turned off is of the value of the terminating resistor Re, e.g., 50 ohms, thereby allowing the antenna switch 10Af to achieve impedance matching with other circuits. Therefore, the reception amplifier connected to the reception terminal 18 is rendered stable in operation.

Figure 16:
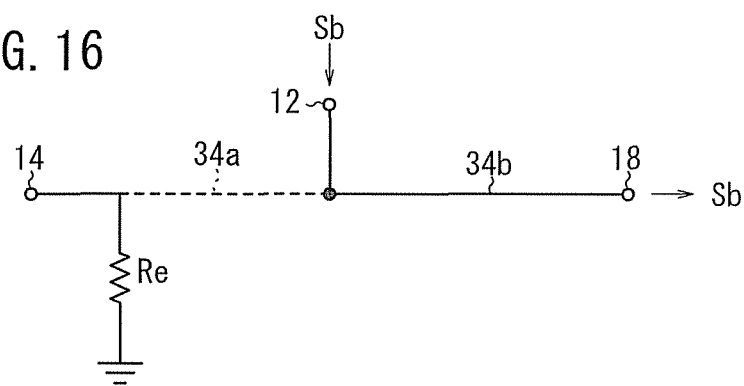

Conversely, when the first reverse voltage of the first control voltage Vc1 is applied to the first control terminals 24a, turning off the first PIN diodes D1, and the second forward voltage of the second control voltage Vc2 is applied to the second control terminals 24b, turning on the second PIN diodes D2, the antenna switch 10Af is represented by an equivalent circuit shown in FIG. 16 wherein only the reception terminal 18 is connected to the antenna connection terminal 12 at high frequencies, and a terminating resistor Re of, for example, 50 ohms is connected to the transmission terminal 14. In this case, the impedance on the transmitter side when the switch is turned off is of the value of the terminating resistor Re, e.g., 50 ohms, thereby allowing the antenna switch 10Af to achieve impedance matching with other circuits.

An antenna switch according to a second embodiment (hereinafter referred to as a second antenna switch 10B) will be described below with reference to FIG. 17.

Figure 17:
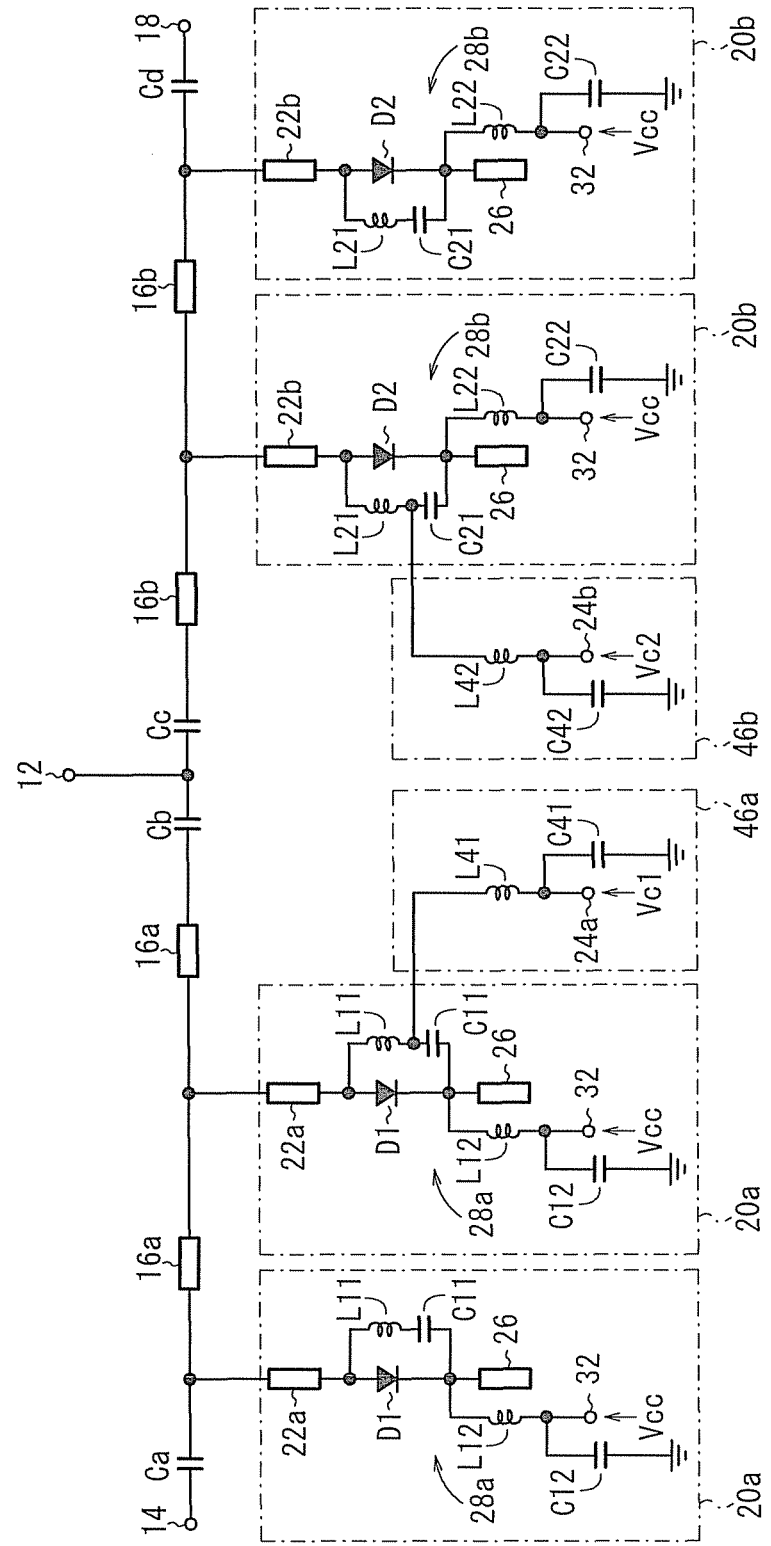
FIG. 17 is a circuit diagram showing a configuration of a second antenna switch.
Figure 18:
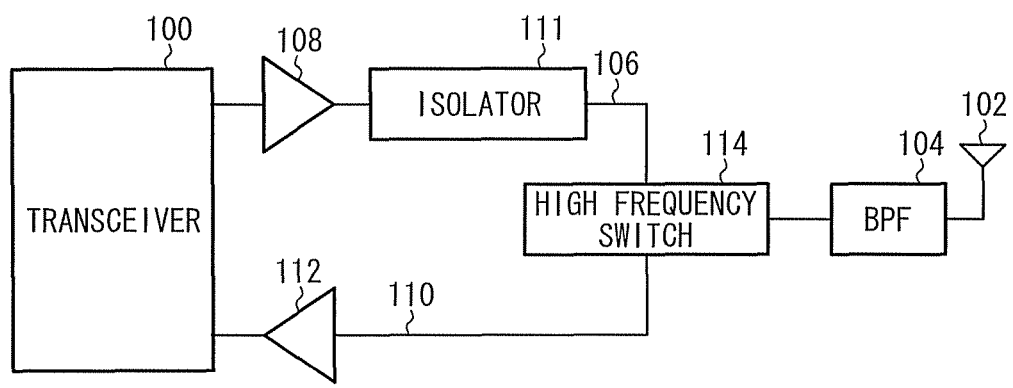
FIG. 18 is a diagram illustrative of a first transmission and reception scheme using a high frequency switch.
Figure 19:
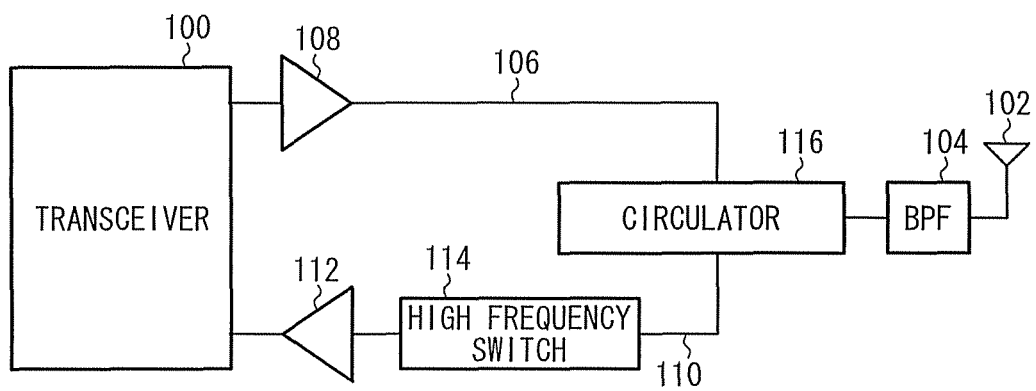
FIG. 19 is a diagram illustrative of a second transmission and reception scheme using a high frequency switch.

As shown in FIG. 17, the second antenna switch 10B is of a configuration substantially similar to the first antenna switch 10A described above, but is different in that the bias voltage Vcc is applied to the cathodes of the first PIN diodes D1 and the cathodes of the second PIN diodes D2.

The second antenna switch 10B comprises capacitors Ca through Cd are connected respectively between the transmission terminal 14 and the first λ/4 signal transmission line 16a adjacent to the transmission terminal 14, between the antenna connection terminal 12 and the first λ/4 signal transmission line 16a adjacent to the antenna connection terminal 12, between the antenna connection terminal 12 and the second λ/4 signal transmission line 16b adjacent to the antenna connection terminal 12, and between the reception terminal 18 and the second λ/4 signal transmission line 16b adjacent to the reception terminal 18. The capacitors Ca through Cd are capacitors for blocking currents for turning on and off PIN diodes to be described later, or blocking direct currents supplied via the bias terminal 32 and operate as a short circuit at high frequencies.

In the two first switch circuits 20a, the first switch circuit 20a that is close to the antenna connection terminal 12 is connected to a first control circuit 46a. In the two second switch circuits 20b, the second switch circuit 20b that is close to the antenna connection terminal 12 is connected to a second control circuit 46b.

The first control circuit 46a is a circuit for applying the first control voltage Vc1 to the respective anodes of the first PIN diodes D1 of the first switch circuits 20a. In this embodiment, the first control circuit 46a comprises a series-connected circuit of a forty-first inductor L41 and a forty-first capacitor C41 which are connected between a junction between the eleventh inductor L11 and the eleventh capacitor C11 of the first switch circuit 20a and GND (ground), and the first control terminal 24a connected to a junction between the forty-first inductor L41 and the forty-first capacitor C41. The forty-first capacitor C41 operates as a capacitor for blocking direct currents supplied via the first control terminal 24a. The forty-first inductor L41 operates as a choke coil for supplying the direct currents that are supplied to the first control terminal 24a to the respective anodes of the first PIN diodes D1. Accordingly, by applying the first control voltage Vc1 to the first control terminal 24a, the first control voltage Vc1 is applied to the respective anodes of the first PIN diodes D1.

To the cathode of the first PIN diode D1, one end of a λ/4 resonant element 26 (or λ/4 resonant line) is connected, and the other end thereof is a free end (infinite resistance). By this impedance changing function, the cathode side of each of the first PIN diodes D1 is grounded at high frequencies. Thus, a combined circuit made up of the first PIN diode D1 and the series-connected circuit of the eleventh inductor L11 and the eleventh capacitor C11 configures a first parallel resonant circuit 28a.

Similarly, the second control circuit 46b is a circuit for applying the second control voltage Vc2 to the respective anodes of the second PIN diodes D2 of the second switch circuits 20b. In this embodiment, the second control circuit 46b comprises a series-connected circuit of a forty-second inductor L42 and a forty-second capacitor C42 which are connected between a junction between the twenty-first inductor L21 and the twenty-first capacitor C21 of the second switch circuit 20b and GND (ground), and the second control terminal 24b connected to a junction between the forty-second inductor L42 and the forty-second capacitor C42. The forty-second capacitor C42 operates as a capacitor for blocking direct currents supplied via the second control terminal 24b. The forty-second inductor L42 operates as a choke coil for supplying the direct currents that are supplied to the second control terminal 24b to the respective anodes of the second PIN diodes D2. Accordingly, by applying the second control voltage Vc2 to the second control terminal 24b, the second control voltage Vc2 is applied to the respective anodes of the second PIN diodes D2.

To the cathode of each of the second PIN diodes D2, one end of a λ/4 resonant element 26 (or λ/4 resonant line) is connected, and the other end thereof is a free end (infinite resistance). Thus, the cathode side of each of the second PIN diodes D2 is grounded at high frequencies. Therefore, a combined circuit made up of the second PIN diode D2 and the series-connected circuit of the twenty-first inductor L21 and the twenty-first capacitor C21 configures a second parallel resonant circuit 28b.

A terminal connected to the junction between the twelfth inductor L12 and the twelfth capacitor C12 of each of the first switch circuits 20a is the bias terminal 32, and also a terminal connected to the junction between the twenty-second inductor L22 and the twenty-second capacitor C22 of each of the second switch circuits 20b is the bias terminal 32. When the bias voltage Vcc is applied to each of the bias terminals 32, the bias voltage Vcc is applied to the respective cathodes of the first PIN diodes D1 and the second PIN diodes D2.

In the second antenna switch 10B, the bias voltage Vcc is applied to the respective cathodes of the first PIN diodes D1 and the second PIN diodes D2, the first control voltage Vc1 is applied to the respective anodes of the first PIN diodes D1, and the second control voltage Vc2 is applied to the respective anodes of the second PIN diodes D2. Accordingly, the first switch circuits 20a are turned on and the second switch circuits 20b are turned off when the bias voltage Vcc, the first control voltage Vc1, and the second control voltage Vc2 have a magnitude relationship of:

$$0\,V<Vc2<Vcc<Vc1 \text{ or } 0\,V>Vc1>Vcc>Vc2$$

Conversely, the first switch circuits 20a are turned off and the second switch circuits 20b are turned on when the bias voltage Vcc, the first control voltage Vc1, and the second control voltage Vc2 have a magnitude relationship of:

$$0\,V<Vc1<Vcc<Vc2 \text{ or } 0\,V>Vc2>Vcc>Vc1$$

In other words, when the relationship of 0 V<Vcc<Vc1 or 0 V>Vc1>Vcc is established as to the first control voltage Vc1, the first control voltage Vc1 is called as a first forward voltage. Also, when the relationship of 0 V<Vcc<Vc2 or 0

V>Vc2>Vcc is established as to the second control voltage Vc2, the second control voltage Vc2 is called as a second forward voltage. Similarly, when the relationship of 0 V<Vc1<Vcc or 0 V>Vcc>Vc1 is established as to the first control voltage Vc1, the first control voltage Vc1 is called as a first reverse voltage. Also, when the relationship of 0 V<Vc2<Vcc or 0 V>Vcc>Vc2 is established as to the second control voltage Vc2, the second control voltage Vc2 is called as a second reverse voltage.

As with the first antenna switch 10A, the second antenna switch 10B is also capable of appropriately minimizing the insertion loss caused when the switch circuits are turned on and maximizing the isolation provided when the switch circuits are turned off in a band that is used by the antenna switch. As a result, the loss of a transmission signal caused in the switch circuits is reduced, and an appropriate amount of attenuation at the time the switch circuits are turned off is secured.

Further, in the second antenna switch 10B, since all of the bias voltage Vcc, the first control voltage Vc1, and the second control voltage Vc2 can be set to positive voltages or negative voltages, it is not necessary to use both of a positive power supply and a negative power supply. Thus, a single power supply (positive power supply or negative power supply) is sufficient. When the PIN diodes are reversely biased, the junction capacitance can be small. Further, it is possible to avoid the increase in the number of parts used in the second antenna switch 10B, and the structural complexity of the circuit configuration thereof. Also, the switching speed is not reduced.

Further, it is also possible for the second antenna switch 10B to employ similar configurations of the antenna switches 10Aa to 10Af according to the first to sixth modified examples.

In the embodiments as described above, though the first and second $\lambda/4$ signal transmission lines 16a, 16b are used, which are advantageous particularly to reduction in size for various signal transmission lines, $3\lambda/4$ signal transmission lines etc. may be used instead. Also, though the embodiments described above use the first and second $\lambda/4$ transmission lines 22a, 22b are used, which are advantageous particularly to reduction in size for various transmission lines, $3\lambda/4$ signal lines etc. may be used instead. Further, though the $\lambda/4$ resonant elements 26 (or $\lambda/4$ resonant lines) are used, which are advantageous particularly to reduction in size for various resonant elements or resonant lines, $3\lambda/4$ resonant elements (or $3\lambda/4$ resonant lines) etc. may be used instead.

The high frequency switch according to the present invention is not limited to the above embodiments, but may adopt various configurations without departing from the scope of the invention.

The invention claimed is:

1. A high frequency switch including a first switch circuit connected parallel to at least one first signal transmission line for transmitting a transmission signal from a transmission terminal, the first switch circuit having at least one first PIN diode, and a second switch circuit connected parallel to at least one second signal transmission line for transmitting a reception signal to a reception terminal, the second switch circuit having at least one second PIN diode, wherein
in the first switch circuit, a first transmission line is connected in series to a circuit including the at least one first PIN diode while an anode of the first PIN diode is connected to the first transmission line,
in the second switch circuit, a second transmission line is connected in series to a circuit including the at least one second PIN diode while an anode of the second PIN diode is connected to the second transmission line,
cathodes of the PIN diodes are grounded at high frequencies,
ends of resonant elements or resonant lines are connected to the cathodes of the PIN diodes, and other ends thereof are free ends,
a first control terminal is electrically connected to one of the anode and the cathode of the first PIN diode, a first control voltage being supplied to the first control terminal,
a second control terminal is electrically connected to one of the anode and the cathode of the second PIN diode, a second control voltage being supplied to the second control terminal, and
a bias applying circuit is provided for applying a constant bias voltage to other of the cathodes and the anodes of the PIN diodes.

2. The high frequency switch according to claim 1, wherein the first switch circuit is turned on and the second switch circuit is turned off when $$0\,V<Vc1<Vcc<Vc2 \text{ or } 0\,V>Vc2>Vcc>Vc1,$$ and the first switch circuit is turned off and the second switch circuit is turned on when $$0\,V<Vc2<Vcc<Vc1 \text{ or } 0\,V>Vc1>Vcc>Vc2,$$

where Vc1 represents the first control voltage, Vc2 represents the second control voltage, and Vcc represents the bias voltage.

3. The high frequency switch according to claim 1, wherein the first switch circuit is turned on and the second switch circuit is turned off when $$0\,V<Vc2<Vcc<Vc1 \text{ or } 0\,V>Vc1>Vcc>Vc2,$$ and the first switch circuit is turned off and the second switch circuit is turned on when $$0\,V<Vc1<Vcc<Vc2 \text{ or } 0\,V>Vc2>Vcc>Vc1,$$

where Vc1 represents the first control voltage, Vc2 represents the second control voltage, and Vcc represents the bias voltage.

4. The high frequency switch according to claim 1, wherein fo represents a central frequency of an operating frequency band, and 2 represents a wavelength corresponding to the central frequency fo,
in the first switch circuit, the first transmission line and a parallel resonant circuit including the at least one first PIN diode are connected in series to the first signal transmission line,
in the second switch circuit, the second transmission line and a parallel resonant circuit including the at least one second PIN diode are connected in series to the second signal transmission line,
constants of the parallel resonant circuits are set to equalize resonant frequencies at time the PIN diodes are turned off with the central frequency fo.

5. The high frequency switch according to claim 1, further comprising a directional coupler having the first signal transmission line as a component thereof, for detecting at least a reflected wave of the transmission signal.

6. The high frequency switch according to claim 1, wherein a resistor for forming a terminating resistance is connected parallel to the second PIN diode of the second switch circuit which is connected parallel to the second signal transmission line that is connected at least to the reception terminal.

7. The high frequency switch according to claim 1, wherein the first signal transmission line the second signal transmission line each comprise a λ/4 signal transmission line.

8. The high frequency switch according to claim 1, wherein the first transmission line and the second transmission line each comprise a λ/4 transmission line.

9. The high frequency switch according to claim 1, wherein the resonant element or the resonant line comprises a λ/4 resonant element or a λ/4 resonant line.

* * * * *